(12) United States Patent
Dawson et al.

(10) Patent No.: US 6,563,141 B1
(45) Date of Patent: May 13, 2003

(54) OPTICAL DEVICES

(75) Inventors: Martin David Dawson, Glasgow (GB); Robert William Martin, Glasgow (GB)

(73) Assignee: BTG International Limited, London (GB)

( * ) Notice: Subject to any disclaimer, the term of this patent is extended or adjusted under 35 U.S.C. 154(b) by 0 days.

(21) Appl. No.: 09/673,177

(22) PCT Filed: Apr. 14, 1999

(86) PCT No.: PCT/GB99/01130
§ 371 (c)(1),
(2), (4) Date: Nov. 29, 2000

(87) PCT Pub. No.: WO99/53578
PCT Pub. Date: Oct. 21, 1999

(30) Foreign Application Priority Data

Apr. 14, 1998 (GB) ................................. 9807692

(51) Int. Cl.[7] .............................................. H01L 33/00
(52) U.S. Cl. ........................................ 257/98; 257/103
(58) Field of Search ................................ 257/98, 103

(56) References Cited

U.S. PATENT DOCUMENTS

| | | | |
|---|---|---|---|
| 5,063,569 A | | 11/1991 | Xie |
| 5,424,559 A | * | 6/1995 | Kasahara |
| 5,753,940 A | | 5/1998 | Komoto |
| 5,812,576 A | * | 9/1998 | Bour |
| 5,828,088 A | | 10/1998 | Mauk |
| 6,046,465 A | | 4/2000 | Wang et al. |
| 6,160,833 A | | 12/2000 | Floyd et al. |
| 6,233,267 B1 | | 5/2001 | Nurmikko et al. |
| 6,320,206 B1 | * | 11/2001 | Coman et al. |

OTHER PUBLICATIONS

T. Sakaguchi, A. Katsube, T. Honda, F. Koyama and K. Iga, "MgO/SiO$_2$ Dielectric Multilayer Reflectors for GaN–based Ultra–violet Surface Emitting Lasers", LEOS '95, IEEE Lasers and Electro–Optics Society 1995 Annual Meeting, San Francisco, CA, Oct. 30–31, 1995, vol. 2, No. Conf. 8, Nov. 1, 1995 , pp. 102/103 XP000598339, Institute of Electrical and Electronics Engineers, ISBN: 0–7803–2451–X.

* cited by examiner

*Primary Examiner*—Stephen D. Meier
(74) *Attorney, Agent, or Firm*—Alston & Bird LLP

(57) ABSTRACT

A solid-state, surface-emitting, optical device such as a light emitting diode (LED) or vertical cavity surface emitting laser (VCSEL) has a body of optical gain medium overlying a high reflectivity distributed BRAGG reflector (DBR) mirror which is carried on part of an underlayer. The gain layer is part of an epitaxial layered structure extending from the underlayer over the mirror.

53 Claims, 7 Drawing Sheets

OPTICAL DEVICES

The present invention relates to improvements in or relating to solid-state surface-emitting optical devices. In particular, the invention relates to surface-emitting optical devices having structures based on the InAlGaN quaternary system, especially short-wavelength (less than 600 nm) Gallium Nitride (GaN) vertical-cavity surface emitting lasers (VCSELs) and GaN surface emitting diodes.

According to a first aspect of the present invention there is provided a solid state, surface-emitting, optical device having a body of optical gain medium overlying a high reflectivity distributed Bragg reflector (DBR) mirror which is carried by an underlayer, wherein the DBR mirror is a multi-layer dielectric fabrication having alternate layers of dielectric material with a high refractive index ratio between the adjacent layers in the fabrication, and the body of optical gain medium is part of an epitaxial layered structure extending from the underlayer and over the fabrication.

By virtue of the DBR mirror being formed of dielectric material, the high refractive index ratio can be greater than 1.2; preferably, is greater than 1.3; advantageously, is greater than 1.5, as a result of which few periods (preferably, less than fifteen periods; advantageously less than ten periods) are required to produce a highly reflective mirror (which, as is typical in laser devices, has a reflectivity of the order of 97% or greater) which has the advantage that the fabrication process is simple Preferably, the fabrication is one of an array of columns having a lateral dimension of less than approximately 50 $\mu$m and spaced part (from centre to centre) by less than approximately 100 $\mu$m; advantageously, the columns have a lateral dimension of less than approximately 10 $\mu$m and are laterally spaced by less than approximately 20 $\mu$m. Alternatively the fabrication may be one of an array of stripes or lines extending to a length of 100 $\mu$m or more, separated by a small number of $\mu$m, typically about 10 $\mu$m, and having a width comparable in dimension to the spacing.

It will be appreciated that the underlayer will usually be a substrate having a buffer layer; preferably, the substrate is sapphire, alternatively, the substrate is SiC; preferably, the buffer layer is based on any of the group three (periodic table) nitride. If high quality substrates are available then the underlayer may consist of only the substrate.

The underlayer is typically a plate-like component with the DBR mirror fabrication carried by one surface and with the epitaxial layered structure extending from that surface. The surface may be planar with the fabricated array of columns or stripes upstanding from the planar surface. Alternatively, the surface may be patterned to from columnar or striped depressions in which the fabricated mirror array is located. In each case the epitaxial layered structure extends from the surface and over the fabrication. In the limiting case the depressions extend through the thickness of the component and the DBR mirror fabrication is carried by both the component and the epitaxial layered structure.

The epitaxial structure is formed by combinations from the InAlGaN quaternary system, for example, GaN or alloys thereof. Preferably, the epitaxial structure includes an Indium Gallium Nitride-based (InGaN) Multi-quantum well structure. Such epitaxial structures are variously referred to as homo-epitaxial and hetero-epitaxial.

Preferably, one of the alternate layers in the multi-layer dielectric fabrication is silicon dioxide ($SiO_2$) and the other alternate layer is titanium dioxide ($TiO_2$). The $SiO_2/TiO_2$ combination has a very high refractive index ratio (approximately 1.8) and is particularly suitable for operation near the 450 nm wavelength where absorption is very low. Other suitable dielectric layers may be used, however, and these include: $MgF_2$, $CaF_2$, $Al_2O_3$, ZnS, AlN, SiC, $Si_3N_4$ and $ZrO_2$; in combinations such as: $SiO_2/SiC$, $SiO_2/Si_3N_4$, $CaF_2/ZnS$, $Al_2O_3/TiO_2$, $SiO_2/AlN$, and $SiO_2/ZrO_2$. The $SiO_2/ZrO_2$ combination is particularly suited to operation at about the 400 nm wavelength and has a refractive index radio of about 1.4.

Preferably, the body of optical gain medium is surmounted by a conductively-doped layer and overlies a conductively-doped layer surmounting the DBR mirror and electrodes are connected to the conductively-doped layers for electrical activation of the device, whereby the device is operably as a diode.

Preferably, a further mirror which is partially optically transmissive is disposed on the epitaxial structure in registration with the DBR mirror so that the epitaxial structure functions as a solid state optical cavity.

Where the optical device is a light-emitting diode, the further mirror has a reflectivity in the range from approximately 50% to 90%, so that lasing is not initiated. Where the optical device is a VCSEL, the further mirror has a reflectivity higher than approximately 98%, so that lasing is initiated and, provided that the underlayer is transmissive, the lasing output may be taken either through the DBR mirror or the further mirror according to the respective reflectivities.

The further mirror may be made of any convenient materials, such as semiconductors, metals and/or dielectrics.

According to a second aspect of the present invention there is provided a method of fabricating a solid-state, surface-emitting, optical device incorporating an improved distributed Bragg reflector (DBR) mirror, the method comprising the steps of:

providing an underlayer;

growing a multi-layer coating on the underlayer, the coating comprising alternate layers of high refractive index dielectric and low refractive index dielectric;

selectively removing portions of the coating to provide an array of free-standing dielectric fabrications whereby portions of the underlayer are revealed between adjacent fabrications;

expitaxially growing a semiconductor layered structure incorporating a body of optical gain medium on the revealed portions of the underlayer so that a lower part of the structure grows up and laterally on top of the free-standing dielectric fabrications, and an upper part of the structure incorporates the body of optical gain medium and overlies the fabrications so that one of the free-standing fabrications provides the DBR mirror.

By virtue of this aspect of the present invention, an efficient surface-emitting optical device (such as a GaN VCSEL) incorporating a DBR mirror having few periods may be fabricated. The optical gain medium overlying the DBR mirror is substantially defect-free because the mirror stops threading dislocations propagating from the underlayer. Because threading dislocations propagate vertically, the optical gain medium above the DBR is laterally offset from any threading dislocations propagating from the underlying layer.

The method may further comprise the steps of growing a further mirror on the body of optical gain medium;

providing a first electrode electrically connected to one side of the optical gain medium in registration with said one of the free-standing fabrications; and providing a second electrode electrically connected to the opposite side of the optical gain medium;

so that the optical gain medium functions as an optical cavity which may be electrically activated by the electrodes.

Conveniently the fabrication is in the form of an array of individual columns or of stripes (lines) extending parallel to the crystallographic direction <1, −1, 0, 0> of the underlayer.

Preferably the array of fabrications is provided by pattern etching. Alternatively the 'lift off' technique may be used whereby a pattern of photo-resist material is deposited prior to the multi-layer deposition coating and is subsequently chemically dissolved to remove the overlying multi-layer deposition and to leave the intervening areas of the multi-layer deposition which thereby form the column or striped fabrications.

According to a third aspect of the present invention there is provided a method of fabricating a solid-state surface-emitting optical device incorporating an improved distributed Bragg reflector (DBR) mirror, the method comprising the steps of:

providing an underlayer;

selectively patterning a surface of the underlayer to provide an array of depressions in the surface;

providing an array of dielectric fabrications in the depressions with portions of the underlayer revealed between adjacent fabrications, each fabrication comprising alternate layers of high refractive index dielectric and low refractive index dielectric; expitaxially growing a semiconductor layered structure incorporating a body of optical gain medium on the revealed portions of the underlayer so that a lower part of the structure grows up and laterally on top of the free-standing dielectric fabrications, and an upper part of the structure incorporates the body of optical gain medium and overlies the fabrications so that one of the free-standing fabrications provides the DBR mirror.

According to a fourth aspect of the present invention there is provided a method of fabricating a solid-state surface-emitting optical device incorporating an improved distributed Bragg-reflector (DBR) mirror, the method comprising the steps of:

providing an underlayer of gallium nitride;

patterning the underlayer with laser-drilled holes;

expitaxially growing a semi-conductor layered structure incorporating a body of optical gain medium on a surface of the underlayer so that the lower part of the structure grows up and laterally on the surface and overlies the holes therein; and fabricating a multi-layer coating within the thickness of the holes so that the fabrications are carried by both the underlayer and the epitaxial layered structure overlying the holes.

By selecting the optical gain medium the optical device may operate at wavelengths less than approximately 1 $\mu$m; in particular, by selecting an InGaN-based optical gain medium the optical device may operate at wavelengths less than 650 nm, with anticipated optimal performance at approximately 400–450 nm.

These and other aspects of the present invention will be apparent from the following specific description, given by way of example, with reference to the accompanying drawings, in which:

FIGS. 1a to c illustrate the short-wavelength surface-emitting optical devices in accordance with embodiments of the present invention;

Figure 1A:
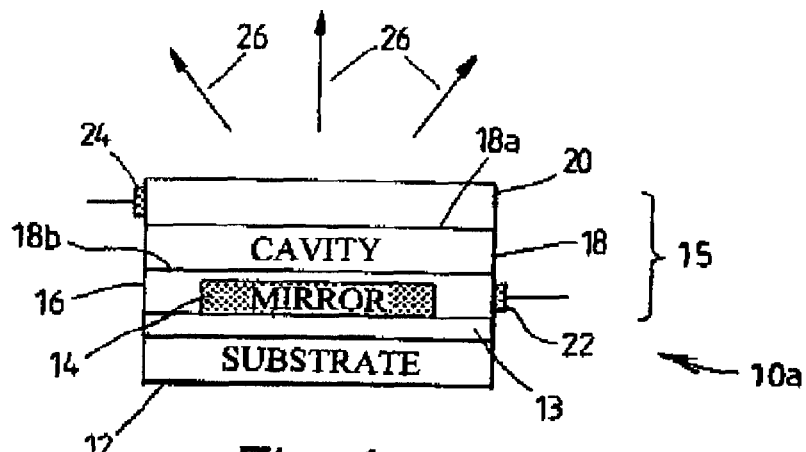

FIG. 1a illustrates an electrically injected, GaN-based, solid-state surface-emitting optical device 10a in accordance with one embodiment of the present invention. The device 10a is a short-wavelength light-emitting diode 10a. The diode 10a has an underlayer in the form of a substrate 12 with a buffer layer 13 expitaxially grown thereon, a DBR mirror 14 disposed on part of the buffer layer 13, and a layered structure 15 disposed on both the mirror 14 and the buffer layer 13 so that the mirror is buried by the layered structure 15.

The layered structure 15 comprises a preparation layer (a first conductive layer) 16, a body of optical gain medium 18 disposed on the preparation layer, and a second conductive layer 20 disposed on the gain medium 18.

The preparation layer 16 is disposed on and around the mirror 14 so that the preparation layer 16 extends from the buffer layer 13, up the sides of the mirror 24 and laterally on top of the mirror 14.

The diode 10a also has a first electrode 22 electrically connected to one side of the optical gain medium 18 via the preparation layer 16, and a second electrode 24 electrically connected to the opposite side of the optical gain medium 18 via the second conductive layer 20.

In use, a forward bias is applied to the optical gain medium 18 via the first and second electrodes 22,24. This potential causes generation of photons in the gain medium 18 and emission of these photons through the top surface 18a of this medium 18 as shown by arrows 26. Photons emitted through the bottom surface 18b of the medium 18 are reflected by the mirror 14 so that they exit the diode 10a through the top surface 18a.

Figure 1B:
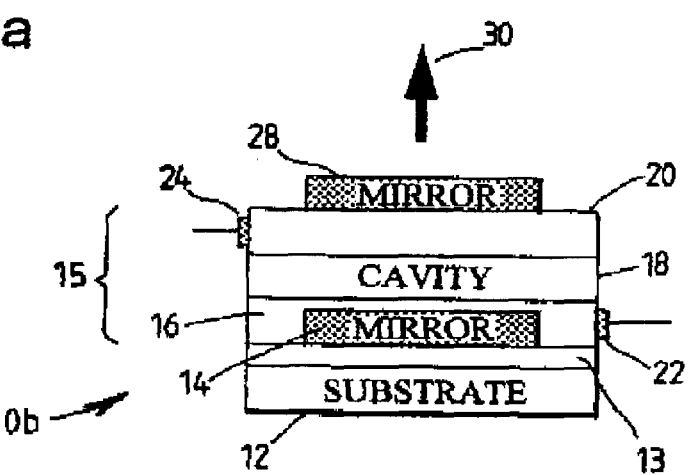

FIG. 1b illustrates an electrically injected, GaN-based, solid-state microcavity surface-emitting optical device 10b in accordance with another embodiment of the present invention. In this embodiment, the device 10b is a short-wavelength VCSEL device; although a similar structure could be used as a microcavity LED. The VCSEL 10b is similar to diode 10a, the difference being that the VCSEL 10b has a second mirror 28 (marginally less reflective than the first mirror) disposed on top of the second conductive layer 20 in registration with the mirror 14. A microcavity LED would typically have a top mirror of lower reflectivity than a VCSEL device would have.

In use, when a potential is applied to the gain medium (which is an optical cavity) 18 via the first and second electrodes 22,24, this potential causes lasing within the cavity 18 and emission of coherent short-wavelength radiation from the surface of the VCSEL 10b via the second (top) mirror 28 as shown by arrow 30. Of course, if mirror 14 were marginally less reflective than mirror 28 the primary emission would be through the substrate 12.

Figure 1C:
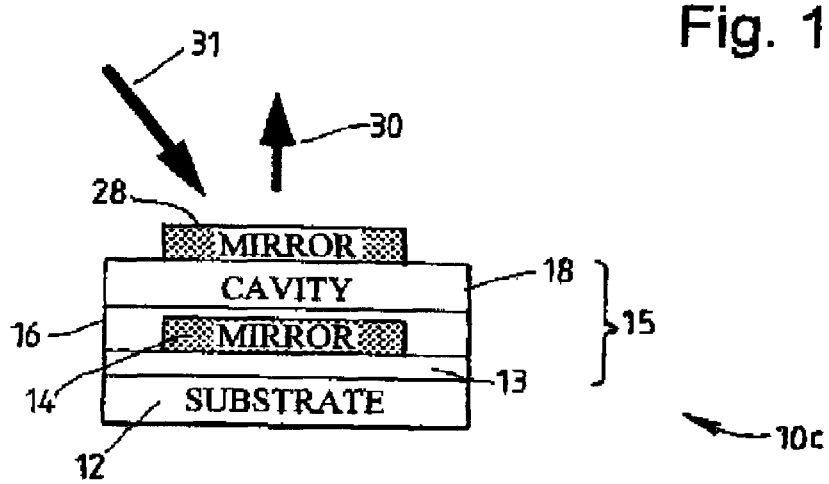

FIG. 1c illustrates a GaN-based, solid-state microcavity surface-emitting optical device 10c in accordance with another embodiment of the present invention. In this embodiment, the device 10c is a short-wavelength optically-pumped VCSEL device 10c. The optically-pumped VCSEL 10c is similar to VCSEL 10b; the difference being that VCSEL 10c does not have any electrodes or a second conductive layer (that is, the layered structure 15 comprises the preparation layer 16, and the gain medium 18). VCSEL 10c is pumped by optical radiation incident on the surface of the VCSEL 10c, as shown by arrow 31.

FIGS. 2a to 2h are schematic diagrams of the structure of VCSEL 10b at various fabrication stages. The VCSEL 10b emits short-wavelength light at some specified wavelength, typically in the range 400–450 nm.

Figure 2A:
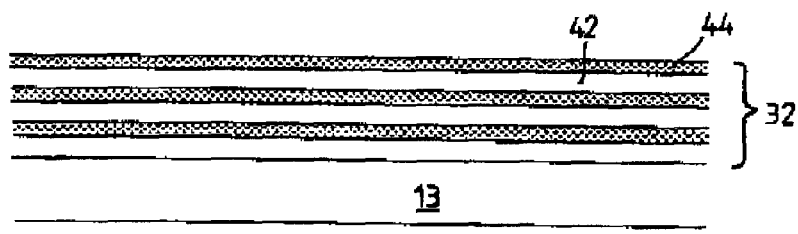
FIGS. 2a to 2h are schematic diagrams of the optical device of FIG. 1b after various fabrication stages.

Referring to FIG. 2a, the VCSEL 10b is expitaxially grown as layers on a sapphire substrate 12. A GaN buffer layer 13 approximately 0.5 μm thick is grown on the sapphire substrate 12. A dielectric multi-layer coating 32 comprising alternate layers of silica ($SiO_2$) 42 and Titanium Dioxide ($TiO_2$) 44 is then grown on the GaN buffer layer 13.

The refractive index of silica at 450 nm is approximately 1.55 and the refractive index of Titanium Dioxide at 450 nm is approximately 2.81, giving a refractive index ratio of approximately 1.8. These values indicate that to obtain a quarter wavelength DBR mirror at, for example, 450 nm the respective thicknesses of the silica layer 42 and the $TiO_2$ layer 44 should be approximately 72.5 nm and 40 nm, which are the respective thicknesses grown in the multi-layer coating 32.

Figure 2B:
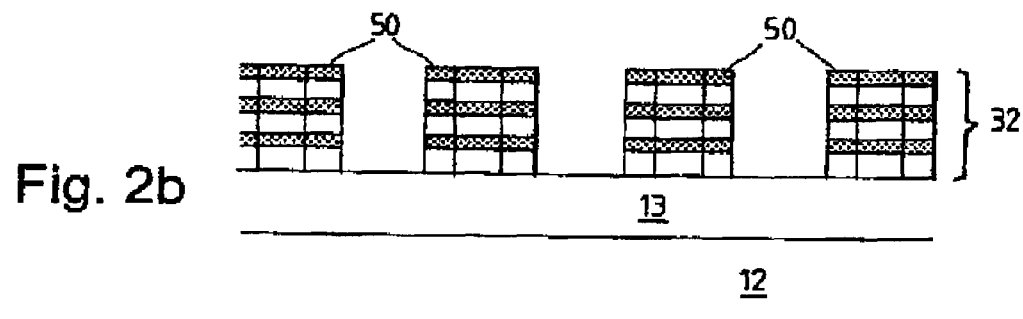
Figure 2C:
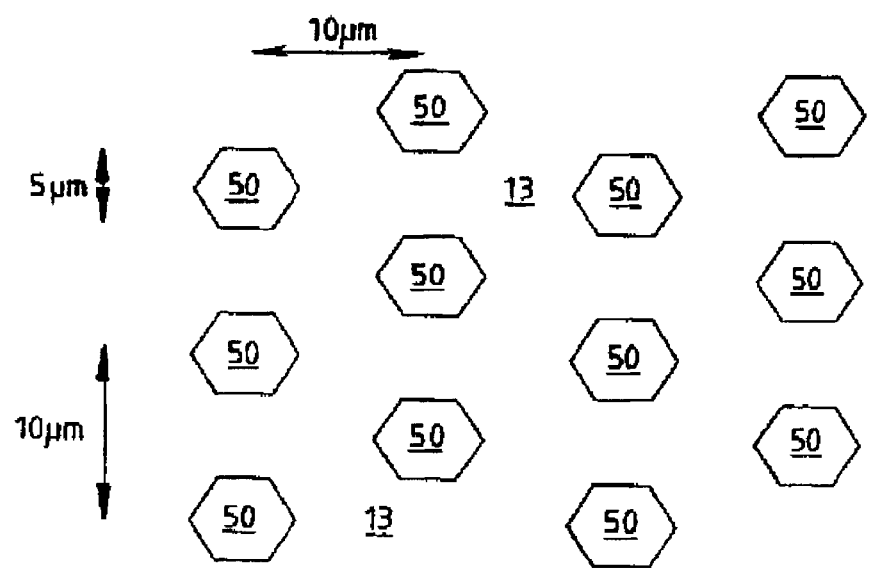
Figure 2D:
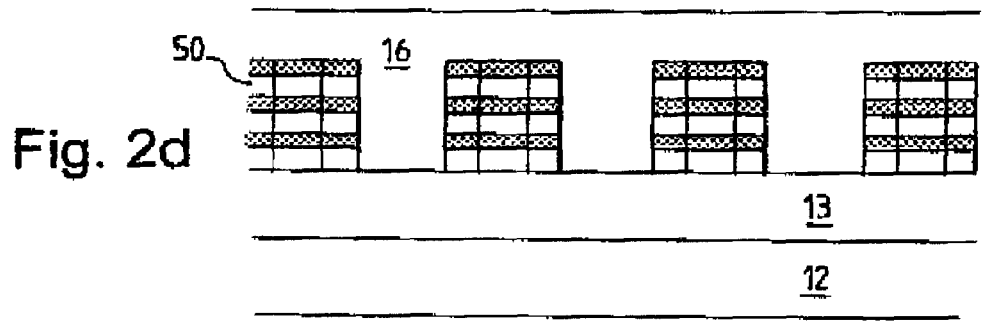
Figure 2E:
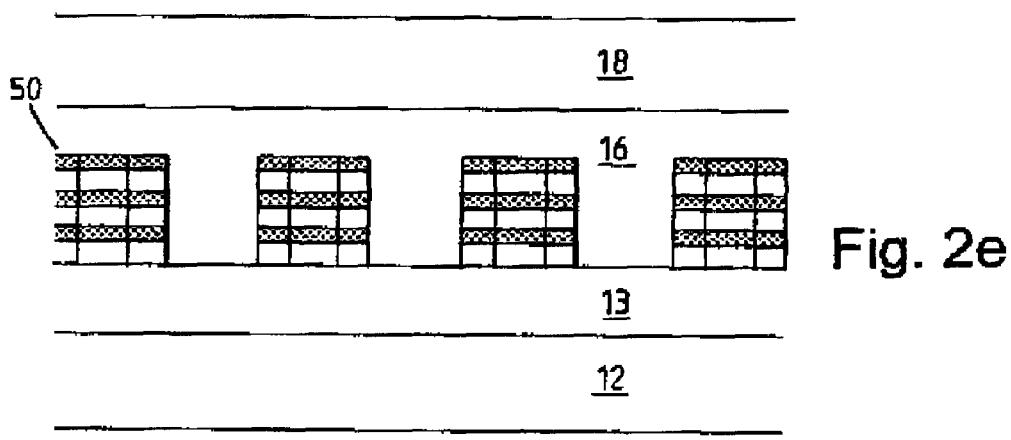
Figure 2F:
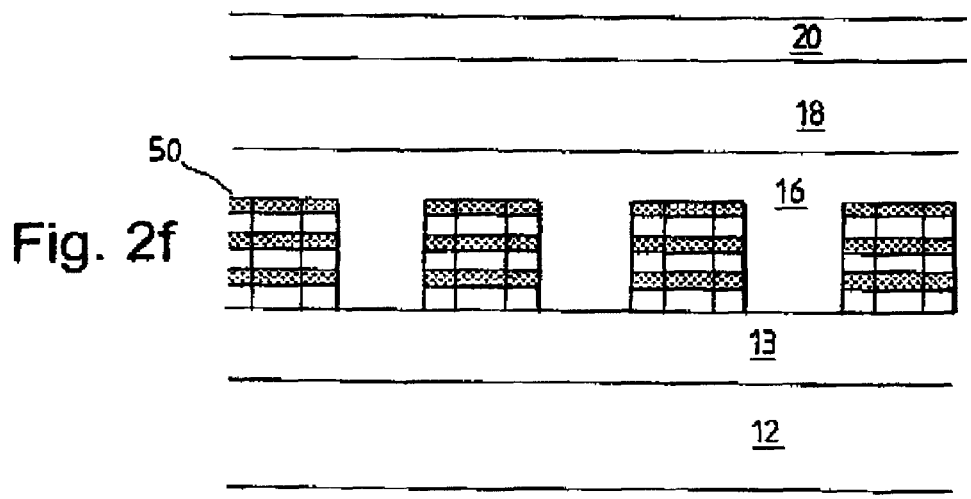
Figure 2G:
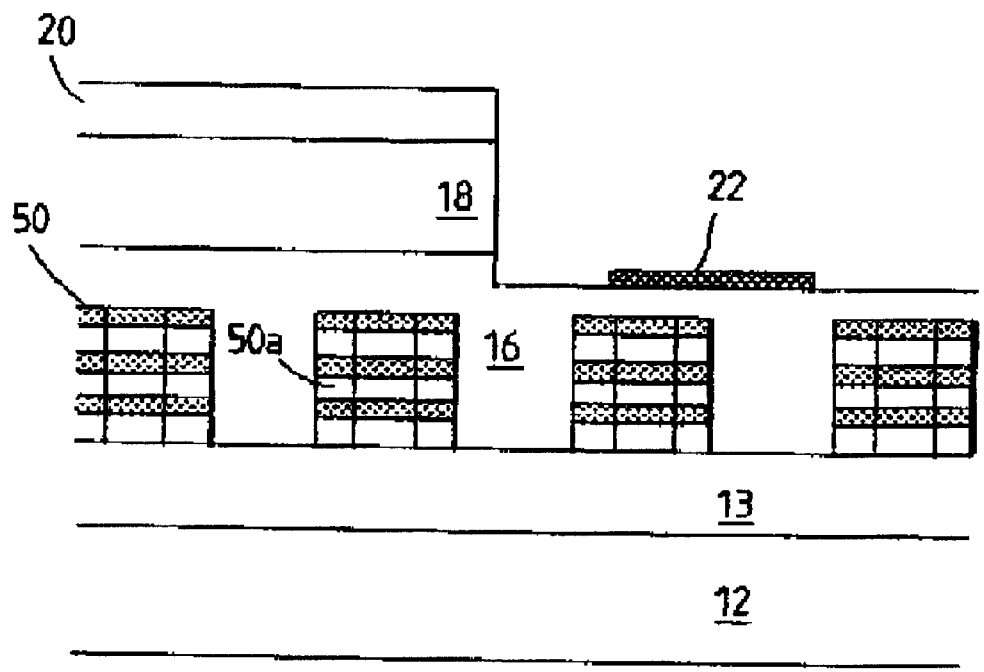
Figure 2H:
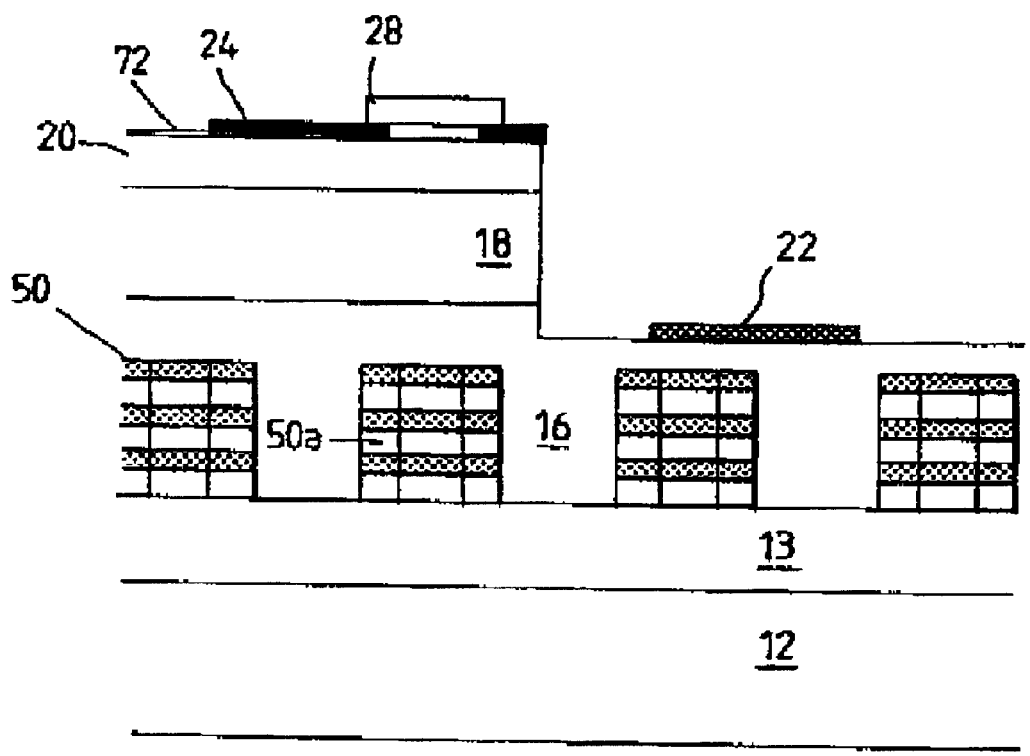
Figure 2I:
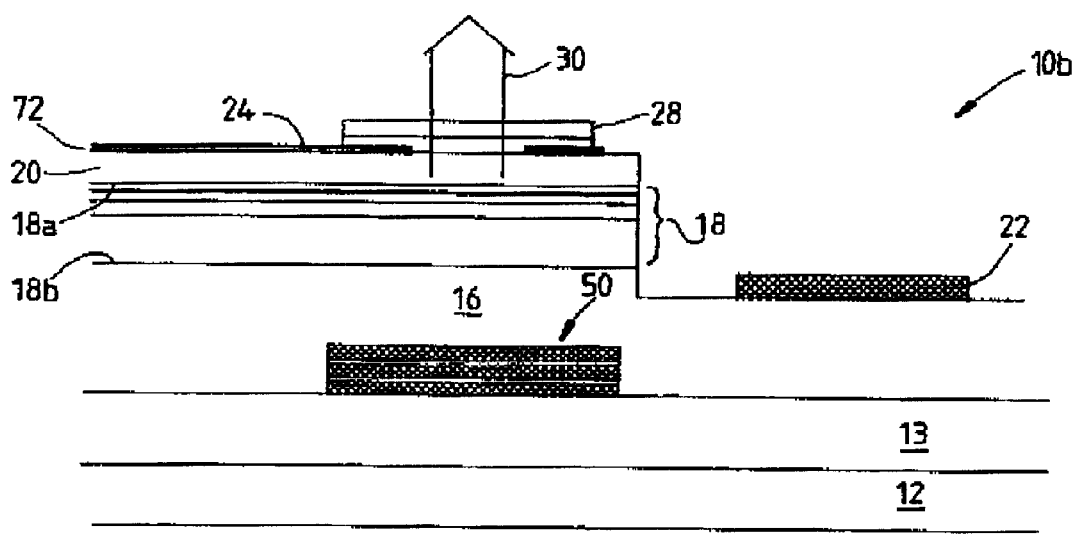
FIG. 2i is a schematic diagram of the device of FIG. 1b after the fabrication process is completed.
Figure 3:
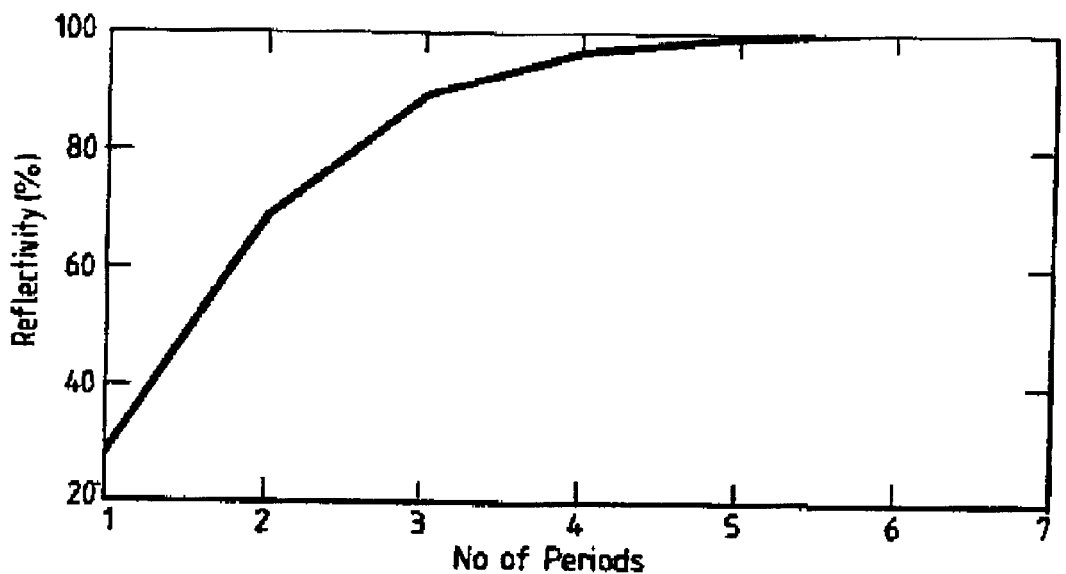
FIG. 3 is a graph of the calculated peak reflectivity versus number of periods for a DBR mirror used in the devices of FIGS. 1a to c.

FIG. 3 shows a graph of the calculated peak reflectivity versus number of periods of $SiO_2/TiO_2$ for the multi-layer coating 32 comprising a 72.5 nm thick $SiO_2$ layer 42 and a 40 nm $TiO_2$ layer 44. The peak reflectivity increases rapidly because of the very large refractive index ratio (1.8), so that 99% reflectivity is achieved for only five periods of $SiO_2/TiO_2$. To ensure that high enough reflectivity (greater than approximately 99%) is achieved, six periods are used in multi-layer coating 32 (although for clarity only three periods are shown in FIGS 2a to 2i).

Figure 4:
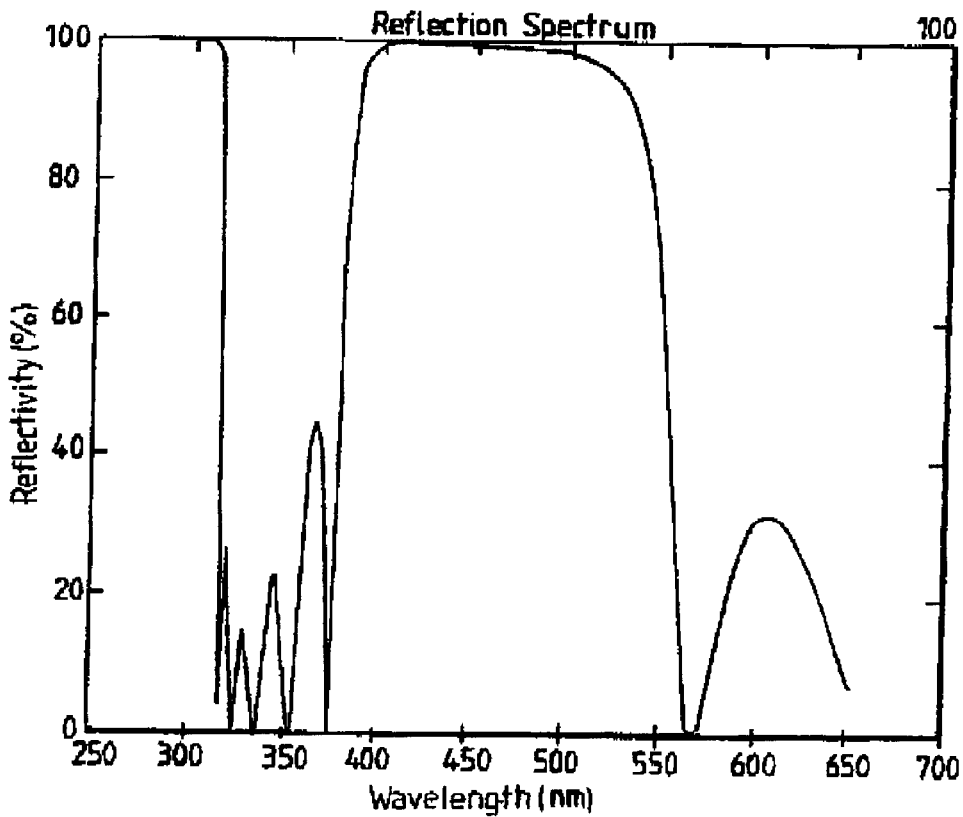
FIG. 4 is a graph of the reflectivity versus wavelength for the DBR mirror used in the devices of FIGS. 1a to c.

FIG. 4 is a graph of the full reflectivity versus wavelength band for the six period multi-layer coating of FIG. 3. FIG. 4 shows that the reflectivity is very high across the spectral range from 425 nm to 475 nm.

Referring to FIG. 2b and also to FIG. 2c (which is a plan view of FIG. 2b), this six period multi-layer coating 32 is pattern-etched using conventional photolithographic and etching techniques to create an array of free-standing columns 50, each column 50 having a lateral dimension of approximately 5 μm and adjacent columns 50 being spaced approximately 10 μm apart (between adjacent centres). Patterning the array of columns reveals portions of the buffer layer 13 between adjacent columns 50. Any one of these columns 50 may be selected for use as the mirror 14.

Referring to FIG. 2d, a preparation layer, in the form of a layer of n-doped GaN 16 is then grown on the areas of the buffer layer 13 between the columns 50 so that the n-doped layer 16 grows up from the GaN buffer layer 13 until the top of the columns 50 is reached and then the layer 16 grows vertically and laterally on top of the columns 50 so that the laterally-grown GaN coalesces to form a continuous n-doped GaN layer 16.

The n-doped GaN layer 16 (preparation layer) is substantially defect-free as a result of this pattern-etching and growth technique; in particular, the areas directly above the columns are substantially free from threading dislocations which propagate vertically from the buffer layer 13. The n-doped layer 16 completely surrounds the columns 50, causing the columns 50 to be buried under the n-doped layer 16.

Figure 5:
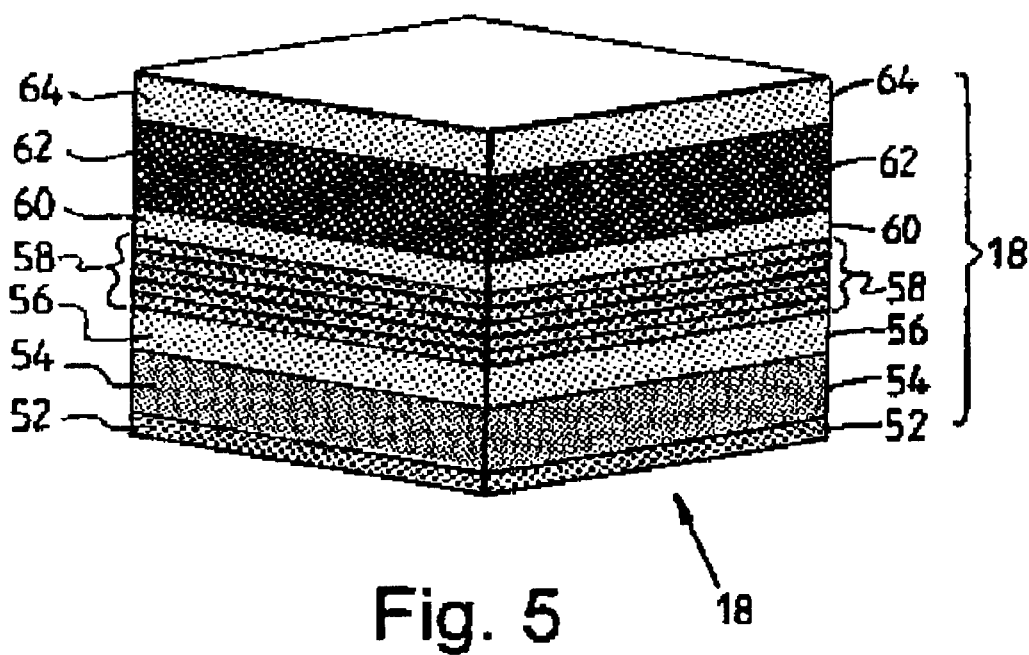
FIG. 5 is a schematic diagram illustrating a part of FIGS 1a to 1c.

Referring to FIG. 2e, an optical cavity (microcavity) 18 is then grown on the n-doped layer 16. This microcavity 18 has an InGaN/GaN/AlGaN active region, one example of which is shown in FIG. 5. The cavity 18 comprises: an n-doped $In_{0.1}Ga_{0.9}N$ layer 52, an n-doped $Al_{0.14}Ga_{0.86}N$/GaN modulation-doped strained-layer superlattice (MD-SLS) layer 54, an n-doped GaN layer 56, an $In_{0.02}Ga_{0.96}N$/$In_{0.15}Ga_{0.95}N$ multi-quantum well layer 58, a p-doped $Al_{0.2}Ga_{0.8}N$ layer 60, a p-doped GaN layer 62, and a p-doped $Al_{0.14}Ga_{0.86}N$/GaN MD-SLS layer 64.

Referring to FIG. 2f, a p-doped GaN layer 20 is then grown on the top surface 18a of the microcavity 18. Subsequently, as shown in FIG. 2g, an area laterally spaced from one of the columns 50A (which is the column selected to function as the DBR mirror 14) is then etched away so that a portion of the n-doped layer 16 is revealed. An electrode 22 composed of Titanium and Aluminum is deposited onto the revealed portion of the n-doped layer 16, so that the electrode 22 is laterally spaced from the column 50A (which is mirror 14). This electrode 22 is used as the n-electrode.

Referring to FIG. 2h, a layer of silica 72 is then grown on the p-doped layer 20. This silica layer 72 is then patterned and etched so that a second electrode 24, made of Gold and Nickel, may be deposited onto conductive layer 20 in the etched areas of silica. This electrode 24 is used as the p-electrode. The p-electrode defines an aperture which is in registration with the mirror 14 and cavity 18.

The p-electrode 24 is electrically connected to the top surface 18a of the microcavity 18 via the p-doped layer 20, and the n-electrode 22 is electrically connected to the bottom surface 18b of microcavity 18 by connection to the n-doped layer 16.

A second mirror 28 is then deposited on the top of p-doped layer 20 at an area vertically above the mirror 14 and the microcavity 18. The second mirror 28 is a dielectric mirror coating which is similar to coating 32 but only has five periods so that the reflectivity of mirror 28 is marginally less than that of coating 32. A second difference between coating 32 and mirror 28 is that mirror 28 is not pattern-etched.

FIG. 2i shows the complete VCSEL 10b, however for clarity only column 50A is shown. In use, carriers are electrically injected into the microcavity 18 by applying a voltage to the n- and p-electrodes 22,24. The mirrors 14,28 provide very high reflectivity so that, in use, high intensity coherent light of approximately 450 nm wavelength is emitted from the top of the VCSEL 10b (through the mirror 28) as shown by arrow 30.

Figure 6:
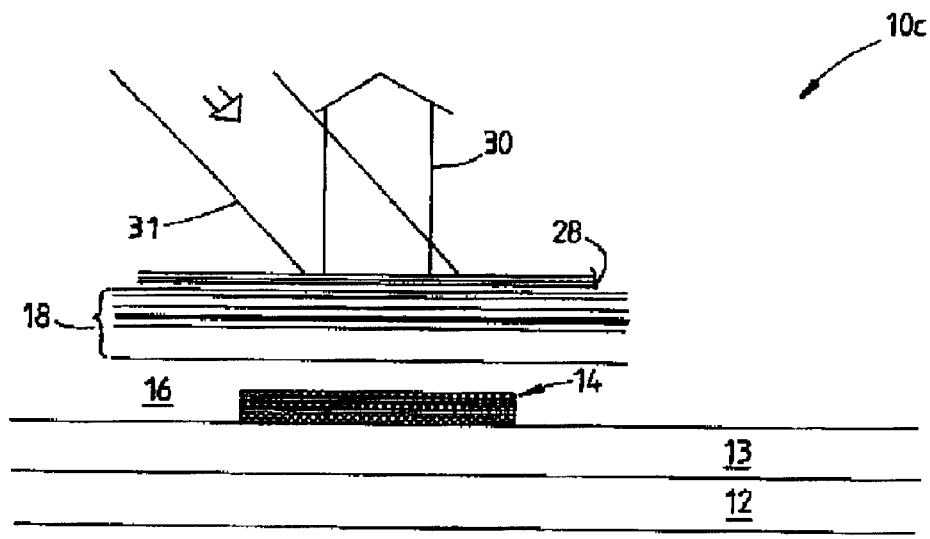
FIG. 6 is a schematic diagram of the device of FIG. 1c.

FIG. 6 is a schematic diagram of the structure of the optically pumped VCSEL 10c of FIG. 1c. The VCSEL 10c also emits short-wavelength light at a specified wavelength in the range of 400–450 nm.

VCSEL 10c is similar to VCSEL 10b; however, there are no electrodes in VCSEL 10c. VCSEL 10c has a sapphire substrate 12, a GaN buffer layer 13, a DBR mirror 14 (formed from a pattern-etched six-period, $SiO_2/TiO_2$ dielectric coating), an n-doped GaN layer 16, and a microcavity 18, all identical to those of FIG. 2i. However, the second mirror 28 is disposed directly on the top of the microcavity 18 (that is, there is no intermediate conductive layer). In this embodiment, carriers are generated in the microcavity 18 by illuminating the top of the VCSEL 10c by a pump beam (as shown by arrow 31) of suitable wavelength and intensity.

Where a GaN light emitting diode is to be fabricated, the structure of FIG. 2i may be fabricated without the top mirror 28, as this is not required for LED operation. Alternatively, a top mirror may be used which is not highly reflective (only partially reflective), so that some radiation would be reflected back to cavity 18 but not sufficient radiation to cause lasing in the cavity. The GaN LED would emit short-wavelength light, for example, centred on approximately 450 nm. The GaN LED may use more than one (for example, an array of one hundred) of the columns 50 to provide a DBR mirror function.

Various modifications may be made to the above described embodiments. For example, the p- and n-electrodes may be fabricated using different materials than those described. In other embodiments the columns may be stripes (lines), rather than the hexagons shown in FIG. 2c, in which case only a portion of the stripe length is used to form the mirror and conveniently the electrode 22 is deposited over a different portion of the same stripe (so as to be located on a substantially defect-free region of layer 16). Substrates other than sapphire may be used, for example silicon carbide may be used. It will be appreciated that an array of surface-emitting devices may be fabricated on a single substrate. Furthermore, in the manufacturing method the underlayer may first be patterned to provide an array of depressions in the surface and thereafter the dielectric fabrications may be deposited in the depressions with portions of the underlayer revealed between adjacent fabrications, the epitaxial structure then being grown on the revealed portions. Alternatively the patterning of depressions may take the form of laser drilled holes (circular or elongate) with the epitaxial structure than being grown on the apertured underlayer which preferably is high quality Gallium Nitride (GaN) and with the Bragg mirror fabrications subsequently being formed in the holes so that the fabrications are carried both by the underlayer and by the epitaxial layered structure overlying the holes.

What is claimed is:

1. A solid state, surface-emitting, optical device having an underlayer, a distributed Bragg reflector (DBR) mirror that is carried by the underlayer and a body of optical gain medium overlaying the DBR mirror,
   wherein the mirror is a multi-layer dielectric having alternate layers of dielectric material with a high refractive index ratio between the adjacent layers and a reflectivity of the order of 97% or more, and
   the body of gain medium is part of an epitaxial layered structure which includes a conductive preparation layer extending from the underlayer up the sides of the DBR mirror and laterally over the top of the DBR mirror where it is coalesced into a single layer.

2. A device as claimed in claim 1, wherein the high refractive index ratio is greater than 1.3.

3. A device as claimed in claim 1, wherein the underlayer (13) comprises a substrate (12) having a buffer layer which is a nitride of a group three element in the periodic table.

4. A device as claimed in claim 1, wherein the homo-epitaxial layered semi-conductor structure (15) is formed by combinations from the InAlGaN quaternary system.

5. A device as claimed in claim 4, wherein the homo-epitaxial layered semi-conductor structure (15) includes an Indium Gallium Nitride-based (InGaN) multi-quantum well structure.

6. A device as claimed in claim 1, wherein a further mirror (28) is disposed on the homo-epitaxial layered semi-conductor structure (15) in registration with the DBR mirror (14,50) so that the homo-epitaxial layered semi-conductor structure (15) functions as a solid state optical cavity.

7. A device as claimed in claim 1, wherein said conductive preparation layer is GaN.

8. A device as claimed in claim 1, wherein the DBR mirror is a column that has a substantially hexagonal cross section.

9. A device as claim in claim 1, wherein the dielectric layers of the DBR comprise $MgF_2$, $CaF_2$, $Al_2O_3$, ZnS, AlN, SiC, $SiO_2$, $Si_3N_4$, $TiO_2$ and $ZrO_2$ in any one of the following combinations: $SiO_2/SiC$; $SiO_2/SiN$, $CaF_2/ZnS$; $Al_2O_3/TiO_2$; $SiO_2/AlN$; $SiO_2/TiO_2$ and $SiO_2/ZrO_2$.

10. A device as claimed in claim 1, wherein the DBR mirror has less than ten periods of alternating layers.

11. A solid state, surface-emitting, optical device having an underlayer, a distributed Bragg reflector mirror (DBR) that is carried by the underlayer and a body of optical gain medium overlying the DBR mirror, wherein:
    the DBR mirror is a multi-layer dielectric having alternate layers of dielectric medium with a high refractive index ratio between the adjacent layers, the periodicity of the alternating layers being less than ten and
    the body of gain medium is part of an epitaxial layered structure that includes a conductive preparation layer that is grown from the underlayer up the sides of the DBR mirror and laterally over the top of the DBR mirror where it is coalesced into a single layer.

12. A device as claimed in claim 11, wherein the DBR mirror is one of an array of free-standing mirrors formed by patterning the multi-layer dielectric.

13. A device as claimed in claim 11, wherein the DBR mirror has a reflectivity of the order of 97% or more.

14. A device as claimed in claim 11, wherein the high refractive index is greater than 1.3.

15. A device as claimed in claim 11, wherein the underlayer comprises a substrate having a buffer layer that is a nitride of a group three element in the periodic table.

16. A device as claimed in claim 11, wherein the conductive preparation layer is GaN.

17. A device as claimed in claim 11, wherein the epitaxial layered structure is formed by combinations from the InAlGaN quaternary system.

18. A device as claimed in claim 17, wherein the epitaxial layered structure includes an Indium Gallium Nitride-based (InGaN) multi-quantum well structure.

19. A device as claimed in claim 11, wherein the DBR mirror is a column that has a substantially hexagonal cross section.

20. A device as claimed in claim 11, wherein a further mirror is disposed on the epitaxial layered structure in registration with the DBR mirror so that the epitaxial layered structure functions as a solid state optical cavity.

21. A solid-state, surface-emitting, optical device having an underlayer, a distributed Bragg reflector mirror (DBR) that is carried by the underlayer, a body of optical gain medium overlying the DBR mirror and a pair of electrodes, wherein:
    the DBR mirror is a multi-layer dielectric having alternate layers of dielectric medium with a high refractive index ratio between the adjacent layers,
    the body of optical gain medium is part of an epitaxial layered structure that includes a conductive preparation layer that is grown from the underlayer up the sides of the DBR mirror and laterally over the top of the DBR mirror where it is coalesced into a single layer and
    one of the electrodes is provided on the conductive preparation layer and extends at least partially over the DBR mirror.

22. A device as claimed in claim 21, wherein the DBR mirror is one of an array of free-standing mirrors formed by patterning the multi-layer dielectric.

23. A device as claimed in claim 21, wherein the DBR mirror has a reflectivity of the order of 97% or greater.

24. A device as claimed in claim 21, wherein the high refractive index is greater than 1.3.

25. A device as claimed in claim 21, wherein the underlayer comprises a substrate having a buffer layer that is a nitride of a group three element in the periodic table.

26. A device as claimed in claim 21, wherein the conductive preparation layer is GaN.

27. A device as claimed in claim 21, wherein the epitaxial layered structure is formed by combinations from the InAlGaN quaternary system.

28. A device as claimed in claim 21, wherein the epitaxial layered structure includes an Indium Gallium Nitride-based (InGaN) multi-quantum well structure.

29. A device as claimed in claim 21, wherein the DBR mirror is a column that has a substantially hexagonal cross section.

30. A device as claimed in claim 21, wherein the periodicity of the alternating layers of the DBR is less than ten.

31. A device as claimed in claim 21, wherein a further mirror is disposed on the epitaxial layered structure in registration with the DBR mirror so that the epitaxial layered structure functions as a solid state optical cavity.

32. A solid state, surface-emitting, optical device having an underlayer, a distributed Bragg reflector mirror (DBR) that is carried by the underlayer, and a body of optical gain medium overlying the DBR mirror, wherein:

the DBR mirror is a multi-layer dielectric having alternate layers of dielectric medium with a high refractive index ratio between the adjacent layers and has a substantially hexagonal cross section, and the body of gain medium is part of an epitaxial layered structure that is grown from the underlayer up the sides of the DBR mirror and laterally over the top of the DBR mirror where it is coalesced into a single layer.

33. A device as claimed in claim 32, wherein a pair of electrodes is provided, one of the electrodes being on the conductive preparation layer and extending at least partially over the DBR mirror.

34. A device as claimed in claim 32, wherein the DBR mirror is one of an array of free-standing mirrors formed by patterning the multi-layer dielectric.

35. A device as claimed in claim 32, wherein the DBR mirror has a reflectivity of the order of 97% or greater.

36. A device as claimed in claim 32, wherein the high refractive index is greater than 1.3.

37. A device as claimed in claim 32, wherein the underlayer comprises a substrate having a buffer layer that is a nitride of a group three element in the periodic table.

38. A device as claimed in claim 32, wherein the conductive preparation layer is GaN.

39. A device as claimed in claim 32, wherein the epitaxial layered structure is formed by combinations from the InAlGaN quaternary system.

40. A device as claimed in claim 32, wherein the epitaxial layered structure includes an Indium Gallium Nitride-based (InGaN) multi-quantum well structure.

41. A device as claimed in claim 32, wherein the periodicity of the alternating layers of the DBR is less than ten.

42. A device as claimed in claim 32, wherein a further mirror is disposed on the epitaxial layered structure in registration with the DBR mirror so that the epitaxial layered structure functions as a solid state optical cavity.

43. A solid state, surface-emitting, optical device having an underlayer, a distributed Bragg reflector mirror (DBR) that is carried by the underlayer, and a body of optical gain medium overlying the DBR mirror, the DBR mirror is a multi-layer dielectric having alternate layers of dielectric medium with a high refractive index ratio between the adjacent layers and the body of gain medium is part of an epitaxial layered structure that is grown from the underlayer up the sides of the DBR mirror and laterally over the top of the DBR mirror where it is coalesced into a single layer, wherein the dielectric layers of the DBR comprise $MgF_2$, $CaF_2$, $Al_2O_3$, ZnS, AlN, SiC, $Si_3N_4$ and $ZrO_2$.

44. A device as claimed in claim 43, wherein the alternate dielectric layers include any one of: $SiO_2$/SiC; $SiO_2$/SiN; $CaF_2$/ZnS; $Al_2O_3$/$TiO_2$; $SiO_2$/AlN and $SiO_2$/$ZrO_2$.

45. A device as claimed in claim 43, wherein the DBR mirror is one of an array of free-standing mirrors formed by patterning the multi-layer dielectric.

46. A device as claimed in claim 43, wherein the DBR mirror has a reflectivity of the order of 97% or greater.

47. A device as claimed in claim 43, wherein the underlayer comprises a substrate having a buffer layer that is a nitride of a group three element in the periodic table.

48. A device as claimed in claim 43, wherein the conductive preparation layer is GaN.

49. A device as claimed in claim 43, wherein the epitaxial layered structure is formed by combinations from the InAlGaN quaternary system.

50. A device as claimed in claim 49, wherein the epitaxial layered structure includes an Indium Gallium Nitride-based (InGaN) multi-quantum well structure.

51. A device as claimed in claim 43, wherein the DBR mirror is a column that has a substantially hexagonal cross section.

52. A device as claimed in claim 43, wherein the periodicity of the alternating layers of the DBR is less than ten.

53. A device as claimed in claim 43, wherein a further mirror is disposed on the epitaxial layered structure in registration with the DBR mirror so that the epitaxial layered structure functions as a solid state optical cavity.

* * * * *